(12) United States Patent
Berger et al.

(10) Patent No.: US 8,816,455 B2
(45) Date of Patent: Aug. 26, 2014

(54) MEMORY DEVICES WITH MAGNETIC RANDOM ACCESS MEMORY (MRAM) CELLS AND ASSOCIATED STRUCTURES FOR CONNECTING THE MRAM CELLS

(71) Applicant: Crocus Technology, Inc., Santa Clara, CA (US)

(72) Inventors: Neal Berger, Cupertino, CA (US); Mourad El Baraji, Fremont, CA (US); Amitay Levi, Cupertino, CA (US)

(73) Assignee: Crocus Technology Inc., Santa Clara, CA (US)

( * ) Notice: Subject to any disclaimer, the term of this patent is extended or adjusted under 35 U.S.C. 154(b) by 0 days.

(21) Appl. No.: 13/657,708

(22) Filed: Oct. 22, 2012

(65) Prior Publication Data

US 2014/0110802 A1    Apr. 24, 2014

(51) Int. Cl.
*H01L 29/82* (2006.01)
(52) U.S. Cl.
USPC ............... 257/421; 438/3; 365/157; 365/158
(58) Field of Classification Search
CPC ....... H01L 43/08; H01L 27/22; H01L 43/065; G11C 11/16
USPC ......................... 257/421; 438/3; 365/157–158
See application file for complete search history.

(56) References Cited

U.S. PATENT DOCUMENTS

| 6,950,369 B2 | 9/2005 | Kunikiyo et al. |
| 7,969,768 B2 | 6/2011 | Takizawa et al. |
| 2004/0056289 A1* | 3/2004 | Ooishi ........................... 257/295 |
| 2004/0125646 A1 | 7/2004 | Durlam et al. |
| 2011/0260271 A1* | 10/2011 | Fukui ............................ 257/421 |
| 2012/0201073 A1 | 8/2012 | Berger et al. |
| 2013/0056289 A1* | 3/2013 | Shibukawa et al. ............. 180/62 |

OTHER PUBLICATIONS

Thomas, Shane, International Search Report and Written Opinion issued to International Patent Application No. PCT/US13/65639, Apr. 17, 2014, 9 pgs.
Tsuji et al., A 1.2V 1Mb IT Embedded Mram Core with Folded Bit-Line Array Architecture, Symposium on VLSI Circuits, 2004, Digest of Technical Papers (online), Jun. 2004 [retrieved on Apr. 8, 2014], retrieved from the internet: <URL: http:ieeexplore.ieee.org/xpl/articleDetails.jsp?tp=&amumber=1346647>.

* cited by examiner

*Primary Examiner* — Jami M Valentine
(74) *Attorney, Agent, or Firm* — Cooley LLP

(57) ABSTRACT

A memory device includes a magnetic layer including a plurality of magnetic random access memory (MRAM) cells, a first conductive layer, a layer including a strap connecting MRAM cells included in the plurality of MRAM cells, and a second conductive layer. The first conductive layer includes a conductive portion electrically connected to at least one of the plurality of MRAM cells, and a field line configured to write data to the at least one of the plurality of MRAM cells. The second conductive layer includes a conductive interconnect electrically connected to the at least one of the plurality of MRAM cells, where the magnetic layer is disposed between the first conductive layer and the second conductive layer. At least one of the plurality of MRAM cells is directly attached to the second conductive layer and the strap.

19 Claims, 5 Drawing Sheets

MEMORY DEVICES WITH MAGNETIC RANDOM ACCESS MEMORY (MRAM) CELLS AND ASSOCIATED STRUCTURES FOR CONNECTING THE MRAM CELLS

FIELD OF THE INVENTION

The invention relates generally to memory devices. More particularly, the invention relates to memory devices with magnetic random access memory ("MRAM") cells and associated structures for connecting the MRAM cells.

BACKGROUND

MRAM devices have become the subject of increasing interest, in view of the discovery of magnetic tunnel junctions having a strong magnetoresistance at ambient temperatures. MRAM devices offer a number of benefits, such as faster speed of writing and reading, non-volatility, and insensitivity to ionizing radiations. Consequently, MRAM devices are increasingly replacing memory devices that are based on a charge state of a capacitor, such as dynamic random access memory devices and flash memory devices.

In a conventional implementation, a MRAM device includes an array of MRAM cells, each one of which includes a magnetic tunnel junction formed of a pair of ferromagnetic layers separated by a thin insulating layer. One ferromagnetic layer, the so-called reference layer, is characterized by a magnetization with a fixed direction, and the other ferromagnetic layer, the so-called storage layer, is characterized by a magnetization with a direction that is varied upon writing of the device, such as by applying a magnetic field. When the respective magnetizations of the reference layer and the storage layer are antiparallel, a resistance of the magnetic tunnel junction is high, namely having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of a MRAM cell is read by comparing its resistance value to a reference resistance value $R_{ref}$, which is derived from a reference cell or a group of reference cells and represents an in-between resistance value between that of the high logic state "1" and the low logic state "0".

In a conventional MRAM cell, a reference layer is typically exchange biased by an adjacent antiferromagnetic layer, which is characterized by a threshold temperature $T_{BR}$ of the antiferromagnetic layer. Below the threshold temperature $T_{BR}$, a magnetization of the reference layer is pinned by the exchange bias of the antiferromagnetic layer, thereby retaining the magnetization of the reference layer in a fixed direction. Above the threshold temperature $T_{BR}$, the exchange bias substantially vanishes, thereby unpinning the magnetization of the reference layer. Consequently, and in order to avoid data loss, an operation temperature window of the conventional MRAM cell has an upper bound defined by the threshold temperature $T_{BR}$.

In the case of a MRAM cell that is implemented for thermally assisted switching ("TAS"), a storage layer also is typically exchange biased by another antiferromagnetic layer, which is adjacent to the storage layer and is characterized by a threshold temperature $T_{BS}$ that is smaller than the threshold temperature $T_{BR}$. Below the threshold temperature $T_{BS}$, a magnetization of the storage layer is pinned by the exchange bias, thereby inhibiting writing of the storage layer. Writing is carried out by heating the MRAM cell above the threshold temperature $T_{BS}$ (but below $T_{BR}$), thereby unpinning the magnetization of the storage layer to allow writing, such as by applying a magnetic field. The MRAM cell is then cooled to below the threshold temperature $T_{BS}$ with the magnetic field applied, such that the magnetization of the storage layer is "frozen" in the written direction.

While offering a number of benefits, a conventional TAS-type MRAM device suffers from certain deficiencies. Specifically, a write operation temperature window is defined by $T_{BR}-T_{BS}$ and, therefore, is bounded by the threshold temperature $T_{BR}$ at the upper end and the threshold temperature $T_{BS}$ at the lower end. Because of practical constraints on antiferromagnetic materials for exchange bias, the write operation temperature window can be rather limited, such as to a range less than 200° C. or less than 150° C. Moreover, in the case of an array of TAS-type MRAM cells, characteristics of individual cells can vary across the array due to manufacturing variability. This variability can result in a distribution of the threshold temperatures $T_{BS}$ and $T_{BR}$ for the array, which, for example, can amount up to ±30° C., thereby further reducing the write operation temperature window. In addition, this variability can impact a resistance of magnetic tunnel junctions across the array and can result in a distribution of the resistance values $R_{min}$ and $R_{max}$ for the array, thereby complicating a comparison between a measured resistance value of an individual cell and a reference resistance value $R_{ref}$ during reading. Consequently, a tight tolerance control can be required during manufacturing, and this tight tolerance control can translate into lower manufacturing yields and higher manufacturing costs.

It is against this background that a need arose to develop the memory devices and related methods described herein.

SUMMARY OF THE INVENTION

One aspect of the invention includes an improved apparatus including a magnetic layer including a plurality of magnetic random access memory (MRAM) cells, a first conductive layer, a first via, a layer including a first strap, and a second conductive layer. The first conductive layer includes a first conductive portion electrically connected to the plurality of MRAM cells, and a first field line configured to write data to at least one of the plurality of MRAM cells. The first strap extends from the first via to the first MRAM cell. The first via extends from the first conductive portion to the first strap. The second conductive layer includes a first conductive interconnect extending between the first MRAM cell and the second MRAM cell. The improvement comprises: (1) a second via extending from the first conductive portion to the second conductive layer, the second via to replace the first via; (2) a second conductive interconnect extending from the first MRAM cell to the second via and bypassing the strap, the second conductive interconnect to replace the first conductive interconnect; and (3) a second strap extending from the first MRAM cell to the second MRAM cell, the second strap to replace the first strap.

Another aspect of the invention relates to a memory device. In one embodiment, the memory device includes a magnetic layer including a plurality of magnetic random access memory (MRAM) cells, a first conductive layer, and a second conductive layer. The first conductive layer includes a conductive portion electrically connected to at least one of the plurality of MRAM cells, and a field line configured to write data to the at least one of the plurality of MRAM cells. The second conductive layer includes a conductive interconnect electrically connected to the at least one of the plurality of MRAM cells. The magnetic layer is disposed between the first conductive layer and the second conductive layer. At least one via extends between the first conductive layer and the second conductive layer. The magnetic layer is electrically connected to the conductive portion of the first conductive layer through the at least one via, without any via extending between the magnetic layer and the first conductive layer, and without any via extending between the magnetic layer and the second conductive layer.

In another embodiment, the memory device includes a magnetic layer including a plurality of magnetic random access memory (MRAM) cells, a first conductive layer, a layer including a strap connecting MRAM cells included in the plurality of MRAM cells, and a second conductive layer. The first conductive layer includes a conductive portion electrically connected to at least one of the plurality of MRAM cells, and a field line configured to write data to the at least one of the plurality of MRAM cells. The second conductive layer includes a conductive interconnect electrically connected to the at least one of the plurality of MRAM cells, where the magnetic layer is disposed between the first conductive layer and the second conductive layer. At least one of the plurality of MRAM cells is directly attached to the second conductive layer and the strap.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical manufacturing tolerances or variability of the embodiments described herein.

As used herein, the term "adjacent" refers to being near or adjoining. Adjacent objects can be spaced apart from one another or can be in actual or direct contact with one another. In some instances, adjacent objects can be formed integrally with one another.

As used herein, the terms "connect," "connected," and "connection" refer to an operational coupling or linking. Connected objects can be directly coupled to one another or can be indirectly coupled to one another, such as via another set of objects.

As used herein, the term "main group element" refers to a chemical element in any of Group IA (or Group 1), Group IIA (or Group 2), Group IIIA (or Group 13), Group IVA (or Group 14), Group VA (or Group 15), Group VIA (or Group 16), Group VIIA (or Group 17), and Group VIIIA (or Group 18). A main group element is also sometimes referred to as a s-block element or a p-block element.

As used herein, the term "transition metal" refers to a chemical element in any of Group IVB (or Group 4), Group VB (or Group 5), Group VIB (or Group 6), Group VIIB (or Group 7), Group VIIIB (or Groups 8, 9, and 10), Group IB (or Group 11), and Group IIB (or Group 12). A transition metal is also sometimes referred to as a d-block element.

As used herein, the term "rare earth element" refers to any of Sc, Y, La, Ce, Pr, Nd, Pm, Sm, Eu, Gd, Tb, Dy, Ho, Er, Tm, Yb, and Lu.

DETAILED DESCRIPTION OF EMBODIMENTS OF THE INVENTION

Figure 1:
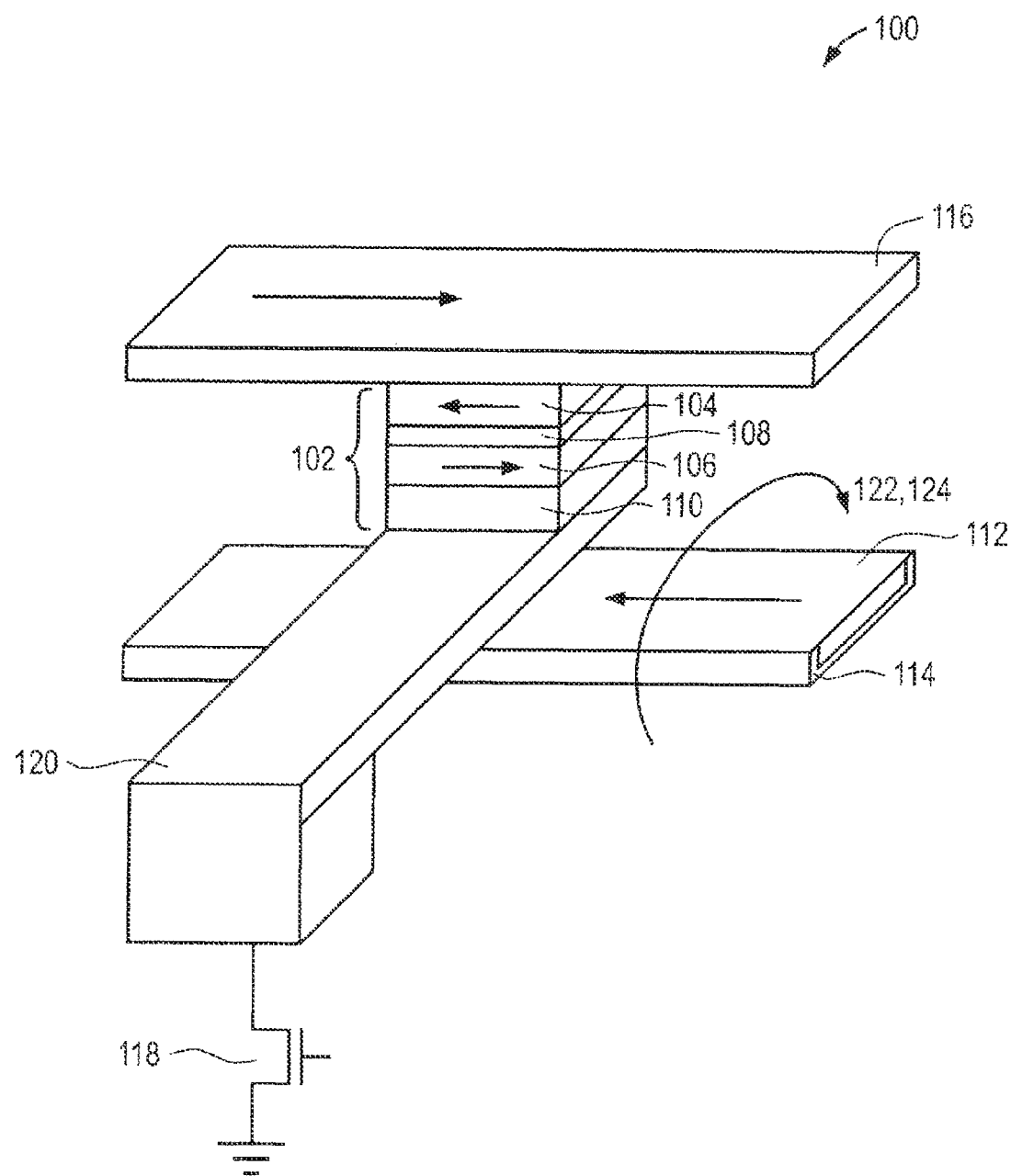
FIG. 1 illustrates a memory device including a MRAM cell, in accordance with prior art.

Attention first turns to FIG. 1, which illustrates a memory device including an MRAM cell, in accordance with prior art. In the illustrated embodiment, the memory device is a MRAM device 100 that includes a MRAM cell 102. For ease of presentation and to motivate certain benefits and functionalities of the MRAM device 100 and other MRAM devices, the single MRAM cell 102 is illustrated in FIG. 1, although it is contemplated that multiple MRAM cells can be included, such as in an interconnected fashion.

In the illustrated embodiment, the MRAM cell 102 is implemented for self-referenced operations, in which a read operation can be carried out based on a relative alignment of magnetizations within the MRAM cell 102 and without requiring a comparison to an external resistance value of a reference cell or a group of reference cells. As further explained below, the self-referenced implementation of the MRAM cell 102 allows the omission of a reference layer with a fixed magnetization and, therefore, allows the operation of the MRAM cell 102 in the absence of, or without regard to, a threshold temperature $T_{BR}$. In such manner, an operation temperature window of the MRAM device 100 can be greatly expanded, such as to allow operation under high ambient temperatures or to allow a faster speed of writing. Moreover, the MRAM device 100 can be afforded with a greater insensitivity to manufacturing variability, thereby increasing manufacturing yields and lowering manufacturing costs. Furthermore, the self-referenced implementation of the MRAM cell 102 allows the MRAM cell 102 to be interconnected with other MRAM cells that are similarly implemented in a vertical stack or a horizontal array, as further explained below.

The MRAM cell 102 is implemented as a magnetic tunnel junction, and includes a sense layer 104, a storage layer 106, and a spacer layer 108 that is disposed between the sense layer 104 and the storage layer 106. Other implementations of the MRAM cell 102 are contemplated. For example, the relative positioning of the sense layer 104 and the storage layer 106 can be reversed, with the storage layer 106 disposed above the sense layer 104.

Each of the sense layer 104 and the storage layer 106 includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 104 and the storage layer 106 can include the same ferromagnetic material or different ferromagnetic materials. As illustrated in FIG. 1, the sense layer 104 includes a soft ferromagnetic material, namely one having a relatively low coercivity, such as no greater than about 0.01 oersted, while the storage layer 106 includes a hard ferromagnetic material, namely one having a relatively high coercivity, such as greater than about 0.01 oersted. In such manner, a magnetization of the sense layer 104 can be readily varied under low-intensity magnetic fields during read operations, while a magnetization of the storage layer 106 remains stable. Suitable ferromagnetic materials include transition metals, rare earth elements, and their alloys, either with or without main group elements. For example, suitable ferromagnetic materials include iron ("Fe"), cobalt ("Co"), nickel ("Ni"), and their alloys, such as permalloy (or $Ni_{80}Fe_{20}$); alloys based on Ni, Fe, and boron ("B"); $Co_{90}Fe_{10}$; and alloys based on Co, Fe, and B. In some instances, alloys based on Ni and Fe (and optionally B) can have a smaller coercivity than alloys based on Co and Fe (and optionally B). A thickness of each of the sense layer 104 and the storage layer 106 can be in the nanometer ("nm") range, such as from about 1 nm to about 20 nm or from about 1 nm to about 10 nm. Other implementations of the sense layer 104 and the storage layer 106 are contemplated. For example, either, or both, of the sense layer 104 and the storage layer 106 can include multiple sub-layers in a fashion similar to that of the so-called synthetic antiferromagnetic layer.

The spacer layer 108 functions as a tunnel barrier, and includes, or is formed of, an insulating material. Suitable insulating materials include oxides, such as aluminum oxide (e.g., $Al_2O_3$) and magnesium oxide (e.g., MgO). A thickness of the spacer layer 108 can be in the nm range, such as from about 1 nm to about 10 nm.

In the illustrated embodiment, the MRAM cell 102 is implemented to store data corresponding to one of a pair of logic states. In other words, the MRAM cell 102 is a single-bit cell that stores a single-bit data value, although multi-bit implementations for storing multi-bit data values are also contemplated. In accordance with the single-bit implementation of the MRAM cell 102, the storage layer 106 has a storage magnetization that is switchable between a pair of directions corresponding to the pair of logic states. Referring to FIG. 1, the MRAM cell 102 also includes a pinning layer 110, which is disposed adjacent to the storage layer 106 and, through exchange bias, stabilizes the storage magnetization along a particular one of the pair of directions when a temperature within, or in the vicinity of, the pinning layer 110 is lower than a threshold temperature $T_{BS}$, such as a blocking temperature, a Neel temperature, or another threshold temperature. The pinning layer 110 unpins, or decouples, the storage magnetization direction when the temperature is at, or above, the threshold temperature $T_{BS}$, thereby allowing the storage magnetization direction to be switched to another one of the pair of directions. In contrast, such a pinning layer is omitted adjacent to the sense layer 104, and, as a result, the sense layer 104 has a sense magnetization direction that is unpinned and is readily varied, with the substantial absence of exchange bias. The pinning layer 110 includes, or is formed of, a magnetic material and, in particular, a magnetic material of the antiferromagnetic type. Suitable antiferromagnetic materials include transition metals and their alloys. For example, suitable antiferromagnetic materials include alloys based on manganese ("Mn"), such as alloys based on iridium ("Ir") and Mn (e.g., IrMn); alloys based on Fe and Mn (e.g., FeMn); alloys based on platinum ("Pt") and Mn (e.g., PtMn); and alloys based on Ni and Mn (e.g., NiMn). In some instances, the threshold temperature $T_{BS}$ of alloys based on Ir and Mn (or based on Fe and Mn) can be in the range of about 120° C. to about 220° C. or about 150° C. to about 200° C., and can be smaller than the threshold temperature $T_{BS}$ of alloys based on Pt and Mn (or based on Ni and Mn), which can be in the range of about 300° C. to about 350° C. Because the sense magnetization direction is unpinned, the threshold temperature $T_{BS}$ can be selected to accommodate a desired application, in the absence of, or without regard to, a threshold temperature $T_{BR}$ that would otherwise set an upper bound of an operation temperature window.

Still referring to FIG. 1, the MRAM device 100 also includes a set of traces (or strip conductors) to provide write and read functionality. Specifically, a bit line 116 is electrically connected to the MRAM cell 102 on the side of the sense layer 104 and may be substantially parallel to a field line 112, which is disposed below and magnetically connected to the MRAM cell 102 on the side of the storage layer 106. In the illustrated embodiment, the field line 112 includes a cladding 114, which forms an exterior of the field line 112 adjacent to the sides and the bottom of the field line 112 and serves to concentrate a magnetic field towards the MRAM cell 102. The cladding 114 includes, or is formed of, a magnetic material and, in particular, a magnetic material of the ferromagnetic type. The MRAM device 100 further includes a transistor 118, which is electrically connected, through a strap 120, to the MRAM cell 102 on the side of the storage layer 106. The transistor 118 is switchable between a blocked mode (OFF) and a saturated mode (ON), thereby allowing the flow of a current through the MRAM cell 102.

During a TAS-type write operation, the MRAM cell 102 is heated by applying a heating current through the MRAM cell 102 via the bit line 116, with the transistor 118 in a saturated mode. The MRAM cell 102 is heated to a temperature above the threshold temperature $T_{BS}$ of the pinning layer 110, such that a magnetization of the storage layer 106 is unpinned. Simultaneously or after a short time delay, the field line 112 is activated to induce a write magnetic field 122 to switch the storage magnetization from an initial direction to another direction. Specifically, a write current is applied through the field line 112 to induce the write magnetic field 122 to switch the storage magnetization direction accordingly. Because the storage magnetization direction can be aligned according to the write magnetic field 122, the storage magnetization direction can be switched between multiple directions according to a write encoding scheme. One possible write encoding scheme is implemented with a pair of directions that are displaced by about 180°, such that the logic state "0" is assigned to one of the pair of directions, and the logic state "1" is assigned to another one of the pair of directions.

Once the storage magnetization is switched to a written direction, the transistor 118 is switched to a blocked mode to inhibit current flow through the MRAM cell 102, thereby cooling the MRAM cell 102. The write magnetic field 122 can be maintained during cooling of the MRAM cell 102, and can be deactivated once the MRAM cell 102 has cooled below the threshold temperature $T_{BS}$ of the pinning layer 110. Because the storage magnetization direction is pinned by the exchange bias of the pinning layer 110, its orientation remains stable so as to retain the written data.

Other implementations of write operations are contemplated. For example, the MRAM cell 102 can be implemented with an anisotropic shape having a relatively high aspect ratio, such as about 1.5 or more. In such an anisotropic-shaped implementation of the MRAM cell 102, the storage magnetization direction can be switched and can remain stable, without requiring the pinning layer 110. As another example, a write operation can be carried out by applying a write current through the MRAM cell 102 via the bit line 116, using the so-called spin transfer torque ("STT") effect. In such a STT-type write operation, the write current can become spin polarized by passing through a polarizing magnetic layer (not illustrated) or through the sense layer 104, and a magnetization of the storage layer 106 can be switched according to a spin-polarized orientation of the write current. Switching of the storage layer magnetization with the spin-polarized write current also can be combined with a TAS-type write operation, such as by heating the MRAM cell 102 above the threshold temperature $T_{BS}$ and then applying the spin-polarized write current through the MRAM cell 102.

During a read operation of the MRAM cell 102, the field line 112 is activated to induce a read magnetic field 124 to vary a magnetization of the sense layer 104. Specifically, a read current is applied through the field line 112 to induce the read magnetic field 124 to vary the sense magnetization direction accordingly. Because the sense layer 104 is subject to little or no exchange bias, the sense magnetization direction can be readily varied under low-intensity magnetic fields and at a temperature below the threshold temperature $T_{BS}$, while the storage magnetization remains stable in a written direction.

For certain implementations, the read operation of the MRAM cell 102 is carried out in multiple read cycles, in which the field line 112 is activated to induce the read magnetic field 124 that is compatible with a write encoding scheme. Because the sense magnetization direction can be aligned according to the read magnetic field 124, the sense magnetization direction can be successively switched between multiple directions according to the write encoding scheme, such as one in which a pair of directions are displaced by about 180°. In such manner, the sense magnetization can be switched from an initial direction, which corresponds to one of the pair of directions of the write encoding scheme, to another direction, which corresponds to another one of the pair of directions of the write encoding scheme.

As part of each read cycle, a degree of alignment between the sense magnetization direction and the storage magnetization direction is determined by applying a sense current through the MRAM cell 102 via the bit line 116, with the transistor 118 in a saturated mode. Measuring a resulting voltage across the MRAM cell 102 when the sense current is applied yields a resistance value of the MRAM cell 102 for a particular read cycle and for a particular direction of the sense magnetization. Alternatively, a resistance value can be determined by applying a voltage across the MRAM cell 102 and measuring a resulting current. When the respective magnetizations of the sense layer 104 and the storage layer 106 are antiparallel, a resistance value of the MRAM cell 102 typically corresponds to a maximum value, namely $R_{max}$, and, when the respective magnetizations are parallel, a resistance value of the MRAM cell 102 typically corresponds to a minimum value, namely $R_{min}$. When the respective magnetizations are between antiparallel and parallel, a resistance value of the MRAM cell 102 is typically between $R_{max}$ and $R_{min}$. Resistance values for multiple read cycles are processed to determine which sense magnetization direction yielded a minimum resistance value, thereby yielding a written direction of the storage layer 106 and its stored data value based on which logic state is assigned to that written direction. Processing of the resistance values can be carried out using a suitable controller in combination with, for example, a sample/hold circuit.

The read operation of the MRAM cell 102 explained above is self-referenced, since it can be carried out based on the relative alignment of magnetizations within the MRAM cell 102, without requiring a comparison to a reference cell or a group of reference cells. As a result, the read operation is less prone to complication and errors in view of manufacturing variability. The self-referenced implementation of the MRAM cell 102 also allows the omission of a reference layer with a fixed magnetization and, therefore, allows the operation of the MRAM cell 102 in the absence of, or without regard to, a threshold temperature $T_{BR}$. In such manner, an operation temperature window of the MRAM cell 102 can be greatly expanded, such as to temperatures up to about 400° C. or more. Moreover, and in view of the expanded operation temperature window, a high-intensity heating current can be applied during writing, such as in the form of a pulse having a duration of less than about 10 nanoseconds, thereby allowing a faster speed of writing.

Other implementations of read operations are contemplated. For example, a faster speed of reading can be achieved with a single read cycle, albeit involving a comparison to a reference resistance value. During the single read cycle, the sense magnetization can be aligned along a predetermined read direction, such as along one of a pair of directions of a write encoding scheme, and a resulting resistance value of the MRAM cell 102 can be compared with a reference resistance value $R_{ref}$, which represents an in-between resistance value between $R_{max}$ and $R_{min}$. A written direction of the storage layer 106 and its stored data value can be determined based on whether the resistance value of the MRAM cell 102 is greater than $R_{ref}$, which indicates an antiparallel alignment with respect to the predetermined read direction, or smaller than $R_{ref}$, which indicates a parallel alignment with respect to the predetermined read direction. As another example, the sense magnetization can be "wiggled" with respect to a predetermined read direction and without completely reversing its direction, by applying an alternating sense current. Here, the alternating sense current can induce a varying read magnetic field, and a resistance value of the MRAM cell 102 can vary alternatively as the sense magnetization is "wiggled" by the varying read magnetic field. A written direction of the storage layer 106 and its stored data value can be determined based on whether the varying resistance value of the MRAM cell 102 is in phase, or out of phase, with respect to the alternating sense current.

Figure 2:
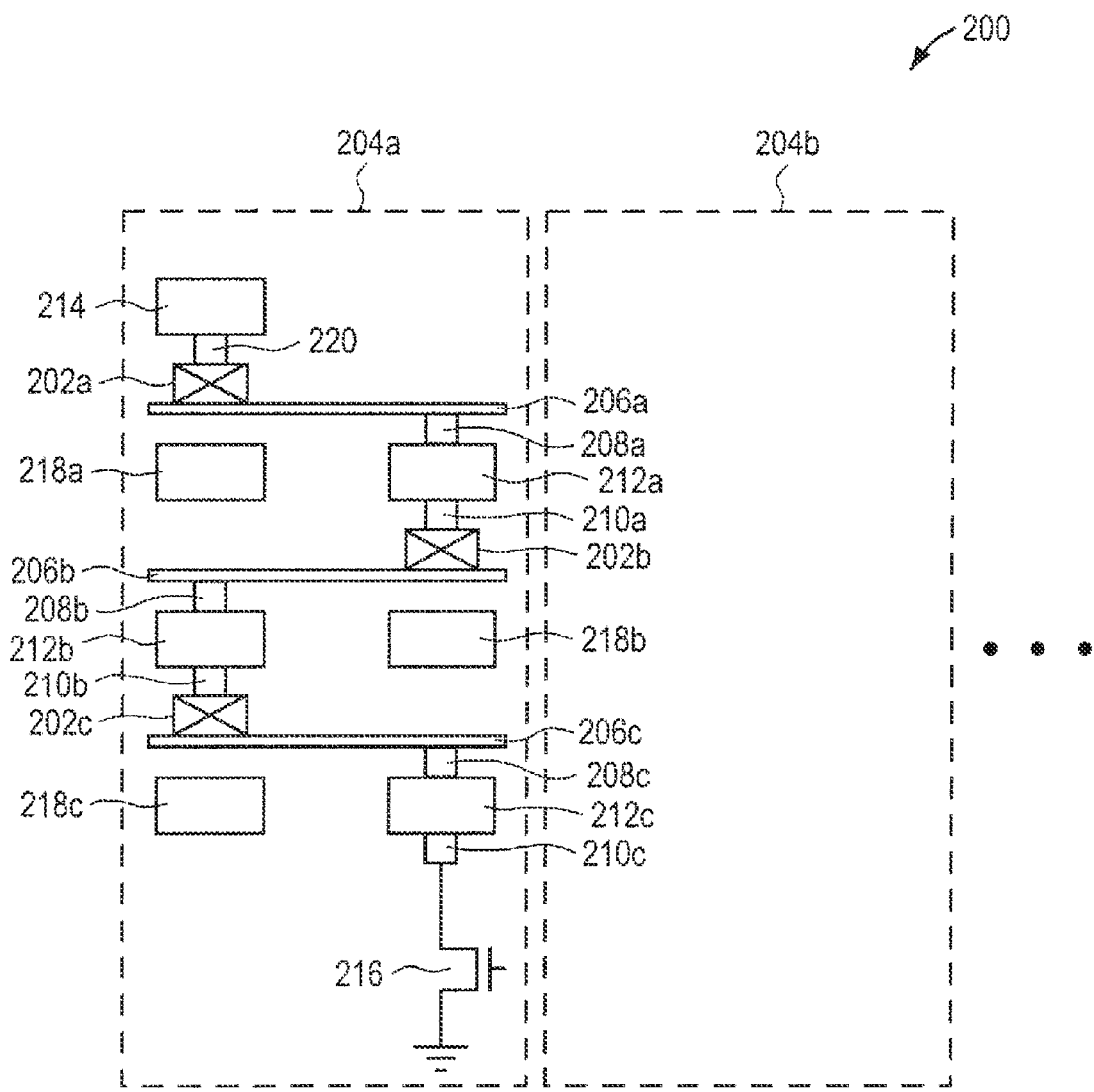
FIG. 2 illustrates a memory device including multiple, series-interconnected MRAM cells arranged in a vertical stack, in accordance with prior art.

Attention next turns to FIG. 2, which illustrates a MRAM device 200 implemented in accordance with prior art. In the illustrated embodiment, the MRAM device 200 includes multiple MRAM cells 202a, 202b, and 202c that are arranged in a vertical stack 204a. Adjacent to the vertical stack 204a is another vertical stack 204b, which can include multiple MRAM cells that are arranged in a similar fashion as the MRAM cells 202a, 202b, and 202c. The vertically stacked implementation of the MRAM device 200 allows multiple MRAM cells to be arranged on top of one another, thereby achieving a higher density of the MRAM cells for a given footprint area. While the two vertical stacks 204a and 204b are illustrated in FIG. 2, it is contemplated that more or less vertical stacks can be included in the MRAM device 200. For ease of presentation, the following explanation is primarily directed to the vertical stack 204a, although the explanation is also applicable to other vertical stacks included in the MRAM device 200. Also, certain aspects of the MRAM device 200 and the MRAM cells included in the MRAM device 200 are implemented in a similar fashion as the MRAM device 100 explained with reference to FIG. 1, and those aspects are not repeated below.

Referring to FIG. 2, the MRAM cells 202a, 202b, and 202c are disposed at respective levels of the vertical stack 204a, with the MRAM cell 202a disposed at a top level (or a third level), the MRAM cell 202b disposed at an intermediate level (or a second level), and the MRAM cell 202c disposed at a bottom level (or a first level). Within the vertical stack 204a, the MRAM cells 202a, 202b, and 202c are electrically connected in series, thereby allowing the flow of a common current through the MRAM cells 202a, 202b, and 202c during write and read operations. During a TAS-type write operation, a common heating current can be applied through the MRAM cells 202a, 202b, and 202c to write multiple ones of the MRAM cells 202a, 202b, and 202c in parallel, resulting in lower power consumption while retaining a desirable speed of writing. In addition, self-referenced implementation of the MRAM cells 202a, 202b, and 202c and the provision of variable sense magnetizations allow an individual one of the MRAM cells 202a, 202b, and 202c to be selected and probed, thereby facilitating read operations of the series-interconnected MRAM cells 202a, 202b, and 202c while retaining the benefits of reduced power consumption.

In the illustrated embodiment, the MRAM device 200 also includes a set of traces (or strip conductors) and a transistor 216 to provide write and read functionality. Specifically, a bit line 214 is electrically connected in series to the MRAM cells 202a, 202b, and 202c on the side of the MRAM cell 202a, and the transistor 216 is electrically connected in series to the MRAM cells 202a, 202b, and 202c on the side of the MRAM cell 202c. The bit line 214 serves as a common bit line that is shared by the MRAM cells 202a, 202b, and 202c, and the transistor 216 serves as a common transistor that is shared by the MRAM cells 202a, 202b, and 202c. The implementation of such shared bit line 214 and such shared transistor 216 conserves valuable footprint area and lowers manufacturing costs. Referring to FIG. 2, the MRAM device 200 further includes a set of field lines, namely a field line 218a, which is disposed below and magnetically connected to the MRAM cell 202a, a field line 218b, which is disposed below and magnetically connected to the MRAM cell 202b, and a field line 218c, which is disposed below and magnetically connected to the MRAM cell 202c. While not illustrated in FIG. 2, each one of the field lines 218a, 218b, and 218c can include a cladding to concentrate a magnetic field towards a respective one of the MRAM cells 202a, 202b, and 202c.

Still referring to FIG. 2, components disposed at different levels of the vertical stack 204a are electrically interconnected through a set of traces (or strip conductors) and a set of vias. Specifically, the bit line 214 is electrically connected to the MRAM cell 202a through a via 220. Also, the MRAM cell 202a is electrically connected to the MRAM cell 202b through a strap 206a, a pair of vias 208a and 210a, and a trace 212a, and the MRAM cell 202b is electrically connected to the MRAM cell 202c through a strap 206b, a pair of vias 208b and 210b, and a trace 212b. Likewise, the MRAM cell 202c is electrically connected to the transistor 216 through a strap 206c, a pair of vias 208c and 210c, and a trace 212c. The vias 208a, 208b, 208c, 210a, 210b, and 210c and the traces 212a, 212b, and 212c provide electrical connection functionality as well as spacing to accommodate the field lines 218a, 218b, and 218c.

Other implementations of the vertical stack 204a are contemplated. For example, while the three levels of the MRAM cells 202a, 202b, and 202c and related components are illustrated in FIG. 2, it is contemplated that more or less levels can be included in the vertical stack 204a. As another example, one or more of the vias 210a, 210b, and 210c can be omitted, while retaining the spacing to accommodate the field lines 218a, 218b, and 218c. As a further example, one or more of the field lines 218a, 218b, and 218c can serve as a common field line that is shared across multiple vertical stacks, such as the vertical stacks 204a and 204b.

During a TAS-type write operation, the vertical stack 204a is heated by applying a common heating current through the MRAM cells 202a, 202b, and 202c via the bit line 214, with the transistor 216 in a saturated mode. The MRAM cells 202a, 202b, and 202c are heated to a temperature above a threshold temperature $T_{BS}$, such that storage magnetizations of the MRAM cells 202a, 202b, and 202c are unpinned. Simultaneously or after a short time delay, the field lines 218a, 218b, and 218c are activated to induce write magnetic fields to switch the storage magnetization directions according to a write encoding scheme, such as one with a pair of directions corresponding to the logic state "0" and the logic state "1". For example, the storage magnetization direction of the MRAM cell 202a can be switched from the logic state "0" to the logic state "1", the storage magnetization direction of the MRAM cell 202b can be switched from the logic state "1" to the logic state "0", and the storage magnetization direction of the MRAM cell 202c can be switched from the logic state "0" to the logic state "1". Once the storage magnetizations are switched to their written directions, the transistor 216 is switched to a blocked mode to inhibit current flow through the vertical stack 204a, thereby cooling the MRAM cells 202a, 202b, and 202c below the threshold temperature $T_{BS}$ and retaining the storage magnetizations along their written directions. In such manner, a multi-bit data value, such as "101", can be written into the MRAM cells 202a, 202b, and 202c in a single write cycle, with each one of the MRAM cells 202a, 202b, and 202c storing a respective portion of the multi-bit data value.

During a read operation, an individual one of the MRAM cells 202a, 202b, and 202c is selectively addressed to determine a respective portion of a multi-bit data value stored by that MRAM cell. In the case that the MRAM cell 202a is read, for example, the field line 218a is activated to induce a read magnetic field to vary a sense magnetization direction of the MRAM cell 202a. During the read operation of the MRAM cell 202a, the field lines 218b and 218c can remain deactivated to reduce power consumption, and sense magnetization directions of the MRAM cells 202b and 202c can remain substantially unchanged, other than possible variations resulting from thermal agitation and possible interactions with the read magnetic field induced by the field line 218a.

In the illustrated embodiment, the read operation of the MRAM cell 202a is carried out in multiple read cycles, in which the sense magnetization direction of the MRAM cell 202a is successively switched according to a write encoding scheme, such as between a pair of directions corresponding to the logic state "0" and the logic state "1". As part of each read cycle, a degree of alignment between the sense magnetization direction and the storage magnetization direction of the MRAM cell 202a is determined by applying a sense current through the vertical stack 204a via the bit line 214, with the transistor 216 in a saturated mode. Measuring a resulting voltage (or a resulting current) across the vertical stack 204a yields a resistance value of the vertical stack 204a for a particular read cycle and for a particular sense magnetization direction of the MRAM cell 202a. The resistance value of the vertical stack 204a includes a series resistance contribution of the MRAM cells 202a, 202b, and 202c, in which the sense magnetization direction of the MRAM cell 202a is switched, while the sense magnetization directions of the MRAM cells 202b and 202c remain substantially unchanged. When the sense magnetization and the storage magnetization of the MRAM cell 202a are antiparallel, the series resistance contribution of the MRAM cells 202a, 202b, and 202c typically has a maximum value, such as a local maximum value, and, when the magnetizations of the MRAM cell 202a are parallel, the series resistance contribution of the MRAM cells 202a, 202b, and 202c typically has a minimum value, such as a local minimum value. Resistance values for multiple read cycles are processed to determine which sense magnetization direction yielded a minimum resistance value, thereby yielding a written direction of the MRAM cell 202a and its stored portion of a multi-bit data value. By operating in a similar fashion, the MRAM cells 202b and 202c can be addressed to determine respective portions of the multi-bit data value stored by the MRAM cells 202b and 202c, thereby allowing the multi-bit data value to be read from the vertical stack 204a on a level-by-level basis or a cell-by-cell basis.

Other implementations of read operations are contemplated. For example, during a read operation of the MRAM cell 202a, the sense magnetization direction of the MRAM cell 202a can be varied, with the field lines 218b and 218c activated to align the sense magnetization directions of the MRAM cells 202b and 202c along a predetermined read direction, such as along one of a pair of directions of a write encoding scheme. In such manner, the MRAM cell 202a can be read, while reducing the impact of variations of the sense magnetization directions of the remaining MRAM cells 202b and 202c. As another example, a multi-bit data value can be written into multiple vertical stacks in parallel, with each one of the vertical stacks storing a respective portion of the multi-bit data value. During a read operation, the multi-bit data value can be read from the vertical stacks in parallel, resulting in a faster speed of reading.

Figure 3:
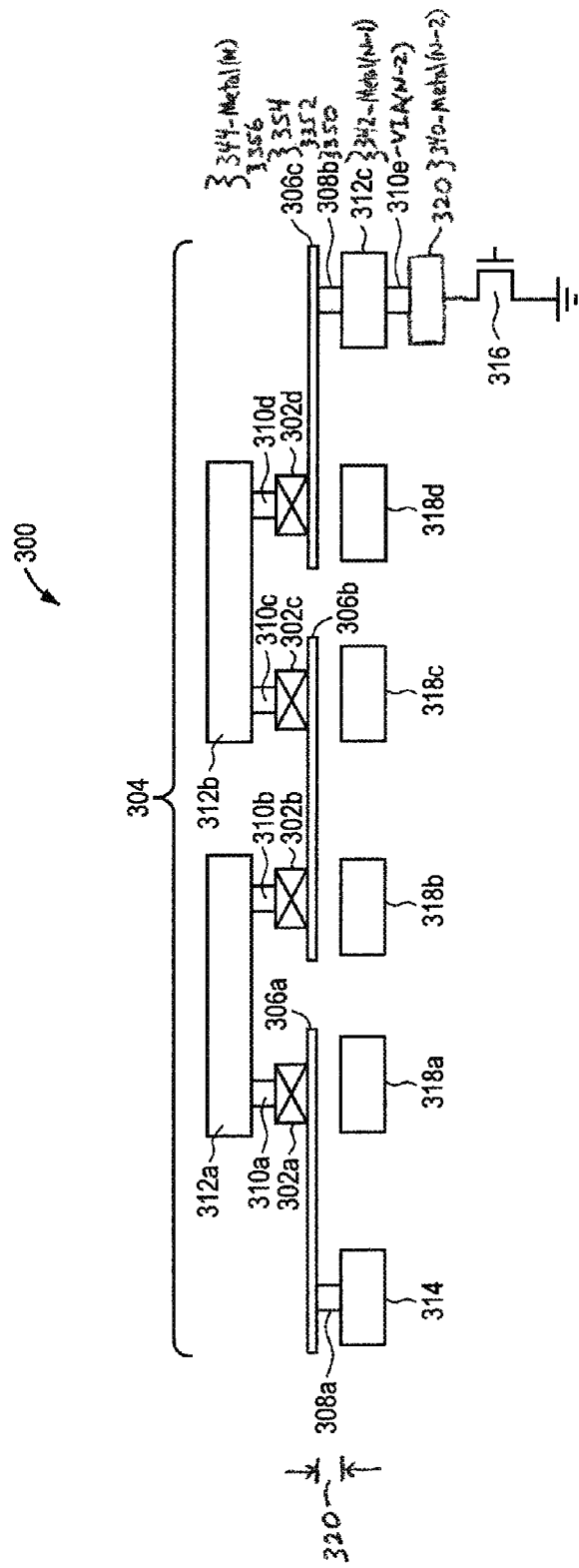
FIG. 3 illustrates a memory device including multiple, series-interconnected MRAM cells arranged in a horizontal array, in accordance with prior art.

FIG. 3 illustrates a MRAM device 300 implemented in accordance with prior art. Certain aspects of the MRAM device 300 are implemented in a similar fashion as the MRAM devices 100 and 200 explained with reference to FIG. 1 and FIG. 2, and those aspects are not repeated below. Referring to FIG. 3, the MRAM device 300 includes multiple MRAM cells 302a, 302b, 302c, and 302d that are arranged in a side-by-side fashion in a horizontal array 304. Within the horizontal array 304, the MRAM cells 302a, 302b, 302c, and 302d are electrically connected in series, thereby allowing the flow of a common current through the MRAM cells 302a, 302b, 302c, and 302d during write and read operations. Although occupying a larger footprint area relative to a vertically stacked implementation, the MRAM device 300 retains the benefits of reduced power consumption, while allowing implementation at lower manufacturing costs and facilitating integration with other types of MRAM cells.

In the illustrated embodiment, the MRAM device 300 also includes a bit line 314, which is shared by and electrically connected in series to the MRAM cells 302a, 302b, 302c, and 302d on the side of the MRAM cell 302a, and a transistor 316, which is shared by and electrically connected in series to the MRAM cells 302a, 302b, 302c, and 302d on the side of the MRAM cell 302d. Referring to FIG. 3, the bit line 314 is electrically connected to the MRAM cell 302a through a via 308a and a strap 306a. Also, the MRAM cell 302a is electrically connected to the MRAM cell 302b through a pair of vias 310a and 310b and a trace 312a, the MRAM cell 302b is electrically connected to the MRAM cell 302c through a shared strap 306b, and the MRAM cell 302c is electrically connected to the MRAM cell 302d through a pair of vias 310c and 310d and a trace 312b. And, the MRAM cell 302d is electrically connected to the transistor 316 through a strap 306c, a pair of vias 308b and 310e, a trace (such as a metal island) 312c, and a trace (such as a metal island) 320. The vias 308a, 308b, and 310e and the trace 312c provide electrical connection functionality as well as spacing to accommodate a set of field lines, namely field lines 318a, 318b, 318c, and 318d, which are disposed below and magnetically connected to respective ones of the MRAM cells 302a, 302b, 302c, and 302d.

Other implementations of the MRAM device 300 are contemplated. For example, while the four MRAM cells 302a, 302b, 302c, and 302d are illustrated in FIG. 3, it is contemplated that more or less MRAM cells can be included in the horizontal array 304. As another example, the bit line 314 can be disposed above the strap 306a, rather than below the strap 306a. As additional examples, one or more of the vias 310a, 310b, 310c, 310d, and 310e can be omitted, and one or more of the field lines 318a, 318b, 318c, and 318d can serve as a common field line that is shared across multiple horizontal arrays. As a further example, the horizontal array 304 can be implemented in combination with a vertical stack of MRAM cells, such as the vertical stack 204a explained with reference to FIG. 2.

Figure 4:
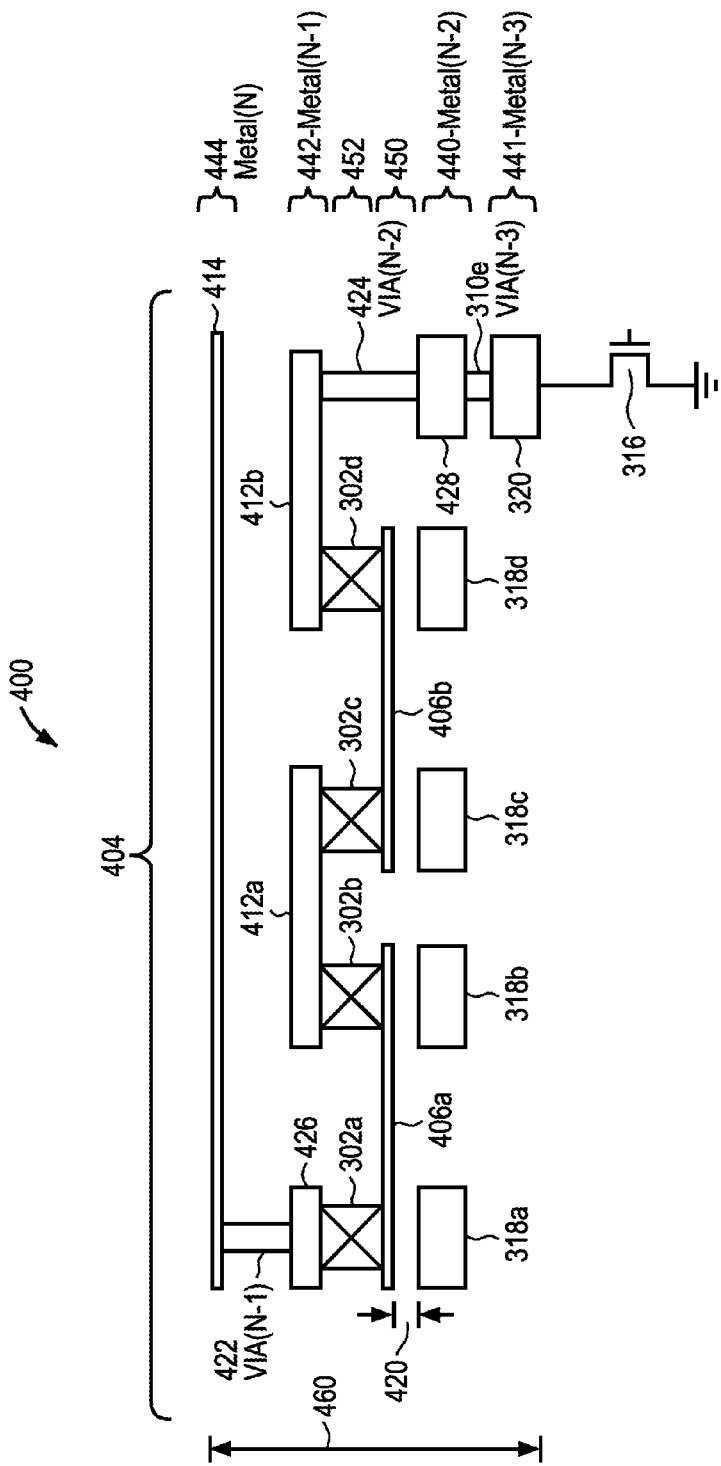
FIG. 4 illustrates a memory device including multiple, series-interconnected MRAM cells arranged in a horizontal array, according to an embodiment of the invention.

FIG. 4 illustrates a MRAM device 400 implemented in accordance with an embodiment of the invention. Certain aspects of the MRAM device 400 are implemented in a similar fashion as the MRAM devices 100 and 200 explained with reference to FIG. 1 and FIG. 2, and those aspects are not repeated below. Referring to FIG. 4, the MRAM device 400 includes multiple MRAM cells 302a, 302b, 302c, and 302d that are arranged in a side-by-side fashion in a horizontal array 404. Within the horizontal array 404, the MRAM cells 302a, 302b, 302c, and 302d are electrically connected in series, thereby allowing the flow of a common current through the MRAM cells 302a, 302b, 302c, and 302d during write and read operations. Although occupying a larger footprint area relative to a vertically stacked implementation, the MRAM device 400 retains the benefits of reduced power consumption, while allowing implementation at lower manufacturing costs and facilitating integration with other types of MRAM cells. Also, as described below, the MRAM device 400 can be built with standard CMOS layers plus only two additional non-CMOS layers. One or more of these additional non-CMOS layers may be magnetic layers. In contrast, the MRAM device 300 of FIG. 3 is built with at least three additional non-CMOS layers plus chemical-mechanical polishing (CMP) to connect the MRAM cells 302 to the traces 312. One or more of these additional non-CMOS layers may be magnetic layers.

In the embodiment of FIG. 4, the MRAM device 400 also includes a bit line 414, which is shared by and electrically connected in series to the MRAM cells 302a, 302b, 302c, and 302d on the side of the MRAM cell 302a, and a transistor 316, which is shared by and electrically connected in series to the MRAM cells 302a, 302b, 302c, and 302d on the side of the MRAM cell 302d. Referring to FIG. 4, the bit line 414 is electrically connected to the MRAM cell 302a through a via 422 and a metal island 426. The via 422 may be a CMOS via (denoted as VIA(N−1)). Also, the MRAM cell 302a is electrically connected to the MRAM cell 302b through a shared strap 406a, the MRAM cell 302b is electrically connected to the MRAM cell 302c through a shared metal interconnect 412a, and the MRAM cell 302c is electrically connected to the MRAM cell 302d through a shared strap 406b. The shared straps 406 may be formed from a magnetic material. Alternatively or in addition, the shared straps 406 may be a thermal barrier, or may be a resistive layer formed from materials such as rubidium or tantalum. The MRAM cell 302d is electrically connected to the transistor 316 through a metal interconnect 412b, a via 424, a trace (such as a metal island) 428, the via 310e, and the trace (such as a metal island) 320. The metal interconnect 412b may be a jumper. The via 424 may be a CMOS via (denoted as VIA(N−2)), and the via 310e may be a CMOS via (denoted as VIA(N−3)). The field lines 318a, 318b, 318c, and 318d are disposed below and magnetically connected to respective ones of the MRAM cells 302a, 302b, 302c, and 302d.

In one embodiment, the MRAM device 400 can be built with standard CMOS layers plus only two additional non-CMOS layers. In this paragraph, the standard CMOS layers included in the horizontal array 404 of the MRAM device 400 are described. The bit line 414 is included in conductive layer 444, so a mask (photolithographic mask or photomask) for selective etching of the conductive layer 444 can be used to form the bit line 414. The conductive layer 444 may be a CMOS metal layer (denoted as Metal(N)). The metal interconnects 412 and the metal island 426 are included in conductive layer 442, so a mask for selective etching of the conductive layer 442 can be used to form the metal interconnects 412 and the metal island 426. The conductive layer 442 may be a CMOS metal layer (denoted as Metal(N−1)), and may be connected to the conductive layer 444 (which may be a CMOS metal layer denoted as Metal(N)) by the via 422 (which may be CMOS VIA(N−1)). The field lines 318 and the metal island 428 are included in conductive layer 440, so a mask for selective etching of the conductive layer 440 can be used to form the field lines 318 and the metal island 428. The conductive layer 440 may be a CMOS layer (denoted as Metal(N−2)), and may be connected to the conductive layer 442 (which may a CMOS layer denoted as Metal(N−1)) by the via 424 (which may be CMOS VIA(N−2)). The via 422 extending from the metal island 426 to the bit line 414 can be formed with a mask for selective etching of vias extending between the conductive layer 442 and the conductive layer 444. The via 424 extending from the metal island 428 to the metal interconnect 412b can be formed with a mask for selective etching of vias extending between the conductive layer 440 and the conductive layer 442. In addition, the via 310e, the metal island 320, and the transistor 316 can also be formed with existing masking layers. The metal island 320 may be included in conductive layer 441, which may be a CMOS metal layer denoted as Metal(N−3).

In one embodiment, the horizontal array 404 of the MRAM device 400 can be formed with the above-described standard CMOS layers plus only two additional non-CMOS layers 450 and 452. A first additional masking layer can be used to form the shared straps 406, which are included in the layer 450. The layer 450 may be a magnetic layer, or may be a non-magnetic conductive layer. A second additional masking layer can be used to form the MRAM cells 302, which are included in the magnetic layer 452. The magnetic layer 452 may be electrically connected to the metal island 428 through the via 424, without any via extending between the magnetic layer 452 and the conductive layer 440, and without any via extending between the magnetic layer 452 and the conductive layer 442. Also, the magnetic layer 452 may be electrically connected to the metal island 428 through the via 424, without any via extending from the magnetic layer 452 to the conductive layer 440, and without any via extending from the magnetic layer 452 to the conductive layer 442. Each of the MRAM cells 302 may be connected to the conductive layer 442 without formation of any vias. Each of the MRAM cells 302 may be connected to the layer 450 without formation of any vias.

Referring to FIG. 3, the MRAM device 300 can be built with standard CMOS layers plus at least three additional non-CMOS layers plus chemical-mechanical polishing (CMP) to connect the MRAM cells 302 to the traces 312. One or more of these additional non-CMOS layers may be magnetic layers. In this paragraph, the standard CMOS layers included in the horizontal array 304 of the MRAM device 300 are described. The traces 312 are included in a conductive layer 344. The conductive layer 344 may be a CMOS metal layer (denoted as Metal(N)). The bit line 314, the field lines 318, and the metal island 312c are included in a conductive layer 342, which may be a CMOS metal layer (denoted as Metal(N−1)). The metal island 320 is included in a conductive layer 340, which may be a CMOS metal layer (denoted as Metal(N−2)). The conductive layer 342 may be connected to the conductive layer 340 by the via 310e (which may be CMOS VIA(N−2)).

In one embodiment, the horizontal array 304 of the MRAM device 300 can be formed with the above-described standard CMOS layers plus three additional non-CMOS layers 350, 352, and 354. The shared straps 306 are included in the layer 352. The shared straps 306 may be formed from a magnetic material. Alternatively or in addition, the shared straps 306 may be a thermal barrier, or may be a resistive layer formed from materials such as rubidium or tantalum. The layer 352 may be a magnetic layer, or may be a non-magnetic conductive layer. The MRAM cells 302 are included in the magnetic layer 354. However, the third additional layer 350 (not needed in the MRAM device 400 of FIG. 4) electrically connects the layer 352 to the conductive layer 342 The additional layer 350 includes the vias 308. In addition, in one embodiment, a fourth additional layer 356 (also not needed in the MRAM device 400 of FIG. 4) electrically connects the conductive layer 344 to the magnetic layer 354. Alternatively, the traces 312 included in the conductive layer 344 may be connected to the MRAM cells 302 included in the magnetic layer 354 through a CMP process.

Referring to FIGS. 3 and 4, the vias 308 and the vias 310a-310d included in the horizontal array 304 of FIG. 3 may be formed with two additional lithographic photomasks. The horizontal array 404 of FIG. 4 is structured such that the vias 308 and the vias 310a-310d (see FIG. 3) are not needed. As a result, the horizontal array 404 may be manufactured with two fewer lithographic photomasks than the horizontal array 304. To remove the vias 308, the bit line 414 may be included in the conductive layer 444 and may be electrically connected to the conductive layer 442 through the via 422. In addition, the metal island 428 may be included in the conductive layer 440 and may be electrically connected to the conductive layer 442 through the via 424. In this way, the horizontal array 404 may not have any via extending between the conductive layer 440 and the layer 450. In one embodiment, the horizontal array 404 may not have any via extending directly from the conductive layer 440 to the layer 450. To remove the vias 310, the MRAM cells 302 may be connected to the metal interconnects 412 and the metal island 426 through a CMP process. In this way, the horizontal array 404 may not have any via extending between the magnetic layer 452 and the conductive layer 442. In addition, the MRAM cells 302 may also be connected to the straps 406 through the CMP process. In this way, the horizontal array 404 may not have any via extending between the magnetic layer 452 and the layer 450. In one embodiment, the horizontal array 404 may not have any via extending directly from the magnetic layer 452 to the conductive layer 442, and may not have any via extending directly from the magnetic layer 452 and the layer 450.

Referring to FIGS. 3 and 4, a distance 420 between the field lines 318 and the MRAM cells 302 in the horizontal array 404 can be reduced relative to a distance 320 between the field lines 318 and the MRAM cells 302 in the horizontal array 304. The distance 420 can be reduced relative to the distance 320 because the vias 308 included in the horizontal array 304 are not present in the horizontal array 404. In one embodiment, the distance 420 may be in the range from about 30 nm to about 100 nm, such as about 50 nm, about 75 nm, and about 100 nm. In contrast, in one embodiment, the distance 420 may be in the range from about 400 nm to about 500 nm, such as about 450 nm. Since the field lines 318 are closer to the MRAM cells 302 in the horizontal array 404 than in the horizontal array 304, less current needs to flow through the field lines 318 to generate a sufficiently large magnetic field to configure the MRAM cells 302. As a result, power consumption and heat dissipation of the horizontal array 404 can be reduced relative to that of the horizontal array 304.

Referring to FIGS. 3 and 4, the footprint size of the horizontal array 404 may be reduced from the footprint size of the horizontal array 304 because the bit line 414 may be positioned above the field lines 318 rather than laterally adjacent to the field lines 318. The bit line 414 may be substantially perpendicular to the field lines 318. Also, referring to FIGS. 3 and 4, the removal of the vias 310 in the horizontal array 404 simplifies formation of the metal interconnects 412, as there is no need to form indentations or protrusions in the metal interconnects 412 to which the vias 310 can be attached.

Other implementations of the horizontal array 404 are contemplated. For example, while the four MRAM cells 302a, 302b, 302c, and 302d are illustrated in FIG. 4, it is contemplated that more or less MRAM cells 302 can be included in the horizontal array 404. As another example, the bit line 414 can be disposed adjacent to the field lines 318 (similar to the bit line 314 shown in FIG. 3). In this example, the metal island 426 may laterally extend over the bit line 414, and the via 422 may extend upward from the bit line 414 to the extended portion of the metal island 426 such that the bit line 414 is electrically connected to the MRAM cells 302. As additional examples, one or more of the field lines 318a, 318b, 318c, and 318d can serve as a common field line that is shared across multiple horizontal arrays. As a further example, the horizontal array 404 can be implemented in combination with a vertical stack of MRAM cells, such as the vertical stack 204a explained with reference to FIG. 2, and/or in combination with another horizontal stack of MRAM cells, such as the horizontal stack 304 explained with reference to FIG. 3.

Figure 5:
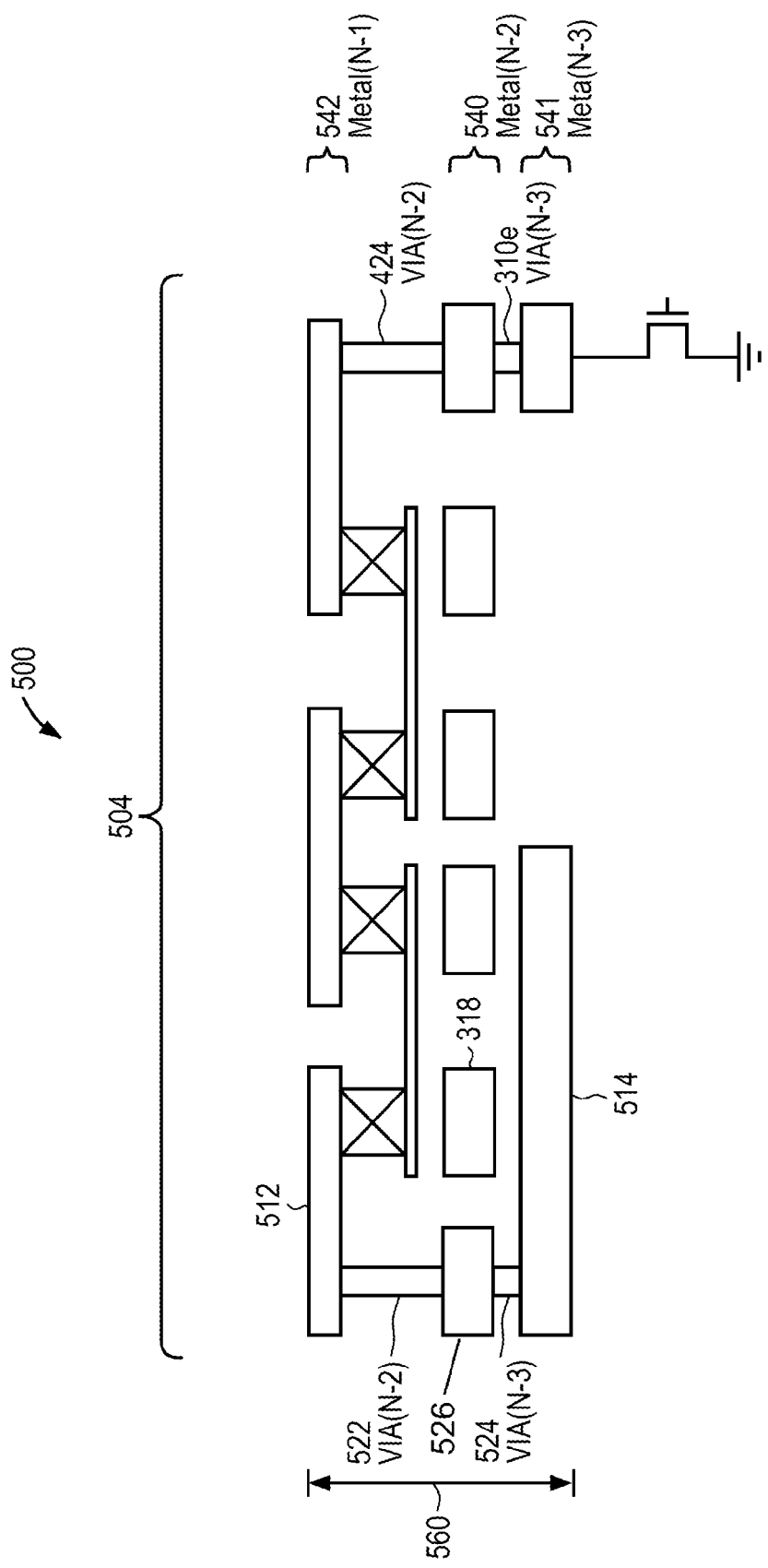
FIG. 5 illustrates a memory device including multiple, series-interconnected MRAM cells arranged in a horizontal array, according to another embodiment of the invention.

FIG. 5 illustrates a MRAM device 500 implemented in accordance with another embodiment of the invention. Referring to FIGS. 4 and 5, the MRAM device 400 and the MRAM device 500 are in most respects similar, so differences are described below. Unlike the MRAM device 400, a bit line 514 included in a horizontal array 504 included in the MRAM device 500 is included in conductive layer 541 (denoted as Metal(N−3)). The conductive layer 541 is otherwise similar to the conductive layer 441. The bit line 514 is electrically connected to conductive layer 542 (denoted as Metal(N−1)) through metal island (trace) 526, via 522, and via 524. The metal island 526 is included in conductive layer 540 (denoted as Metal(N−2)), which is otherwise similar to the conductive layer 440. Metal interconnect 512 is included in conductive layer 542 instead of the metal island 426. Otherwise, the conductive layer 542 is similar to the conductive layer 442. The vias 522 and 524 are also added to the MRAM device 500. A single photomask can be used to form the via 424 and the via 522, so the via 522 is also denoted as CMOS VIA(N−2). A single photomask can also be used to form the via 310e and the via 524, so the via 524 is also denoted as CMOS VIA(N−3). The via 422 is not present in the MRAM device 400.

Referring to FIGS. 4 and 5, a vertical extent 560 of the horizontal array 504 may be reduced from a vertical extent of the horizontal array 404 because the bit line 514 may be included in the conductive layer 541 (Metal(N−3)) instead of a separate conductive layer 444 (Metal(N)). The horizontal array 404 therefore does not include the conductive layer 444. The bit line 514 may be substantially perpendicular to the field lines 318.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A memory device comprising:
   a magnetic layer including a plurality of magnetic random access memory (MRAM) cells;
   a first conductive layer including a conductive portion electrically connected to at least one of the plurality of MRAM cells, and a field line configured to write data to the at least one of the plurality of MRAM cells;
   a layer including a strap connecting MRAM cells included in the plurality of MRAM cells; and
   a second conductive layer including a conductive interconnect electrically connected to the at least one of the plurality of MRAM cells, wherein the magnetic layer is disposed between the first conductive layer and the second conductive layer; and
   a third conductive layer including a bit line electrically connected to the at least one of the plurality of MRAM cells;
   wherein:
   at least one of the plurality of MRAM cells is directly attached to the second conductive layer and the strap;
   the second conductive layer is disposed between the magnetic layer and the third conductive layer; and
   a via extends from the third conductive layer to the second conductive layer.

2. The memory device of claim 1, wherein the bit line is substantially perpendicular to the field line.

3. The memory device of claim 1, wherein the first conductive layer includes a bit line electrically connected to the at least one of the plurality of MRAM cells, the bit line being substantially parallel to the field line.

4. A memory device comprising:
a magnetic layer including a plurality of magnetic random access memory (MRAM) cells;
a first conductive layer including a conductive portion electrically connected to at least one of the plurality of MRAM cells, and a field line configured to write data to the at least one of the plurality of MRAM cells;
a layer including a strap connecting MRAM cells included in the plurality of MRAM cells; and
a second conductive layer including a conductive interconnect electrically connected to the at least one of the plurality of MRAM cells, wherein the magnetic layer is disposed between the first conductive layer and the second conductive layer;
wherein:
at least one of the plurality of MRAM cells is directly attached to the second conductive layer and the strap; and
at least one via extends from the first conductive layer to the second conductive layer.

5. The memory device of claim 4, wherein the bit line is substantially perpendicular to the field line.

6. The memory device of claim 4, wherein the first conductive layer includes a bit line electrically connected to the at least one of the plurality of MRAM cells, the bit line being substantially parallel to the field line.

7. The memory device of claim 4, wherein at least a subset of the plurality of MRAM cells are connected in series by the strap and the conductive portion.

8. The memory device of claim 4, wherein the magnetic layer is electrically connected to the conductive portion of the first conductive layer through the at least one via, without any via extending between the magnetic layer and the first conductive layer, and without any via extending between the magnetic layer and the second conductive layer.

9. The memory device of claim 4, wherein each of the plurality of MRAM cells is connected to the second conductive layer without formation of any vias.

10. The memory device of claim 4, wherein the magnetic layer is electrically connected to the conductive portion of the first conductive layer through the at least one via, without any via extending from the magnetic layer to the first conductive layer, and without any via extending from the magnetic layer to the second conductive layer.

11. The memory device of claim 10, wherein each of the plurality of MRAM cells is connected to the layer without formation of any vias.

12. The memory device of claim 10, wherein the layer is disposed between the magnetic layer and the first conductive layer, without any via extending from the layer to the first conductive layer, and without any via extending from the layer to the second conductive layer.

13. The memory device of claim 1, wherein at least a subset of the plurality of MRAM cells are connected in series by the strap and the conductive portion.

14. The memory device of claim 1, wherein at least one via extends from the first conductive layer to the second conductive layer.

15. The memory device of claim 14, wherein the magnetic layer is electrically connected to the conductive portion of the first conductive layer through the at least one via, without any via extending between the magnetic layer and the first conductive layer, and without any via extending between the magnetic layer and the second conductive layer.

16. The memory device of claim 14, wherein the magnetic layer is electrically connected to the conductive portion of the first conductive layer through the at least one via, without any via extending from the magnetic layer to the first conductive layer, and without any via extending from the magnetic layer to the second conductive layer.

17. The memory device of claim 1, wherein each of the plurality of MRAM cells is connected to the second conductive layer without formation of any vias.

18. The memory device of claim 1, wherein each of the plurality of MRAM cells is connected to the layer without formation of any vias.

19. The memory device of claim 1, wherein the layer is disposed between the magnetic layer and the first conductive layer, without any via extending from the layer to the first conductive layer, and without any via extending from the layer to the second conductive layer.

* * * * *